US010254155B2

(12) United States Patent
Bengtsson et al.

(10) Patent No.: US 10,254,155 B2
(45) Date of Patent: Apr. 9, 2019

(54) MONITORING TORSIONAL OSCILLATIONS IN A TURBINE-GENERATOR

(71) Applicant: ABB Schweiz AG, Baden (CH)

(72) Inventors: Tord Bengtsson, Vasteras (SE); Zoran Gajic, Vasteras (SE); Stefan Roxenborg, Vasteras (SE)

(73) Assignee: ABB Schweiz AG, Baden (CH)

( * ) Notice: Subject to any disclaimer, the term of this patent is extended or adjusted under 35 U.S.C. 154(b) by 135 days.

(21) Appl. No.: 15/509,156

(22) PCT Filed: Sep. 5, 2014

(86) PCT No.: PCT/EP2014/068973
§ 371 (c)(1),
(2) Date: Mar. 6, 2017

(87) PCT Pub. No.: WO2016/034249
PCT Pub. Date: Mar. 10, 2016

(65) Prior Publication Data
US 2017/0276539 A1 Sep. 28, 2017

(51) Int. Cl.
G01H 1/00 (2006.01)
G01R 31/34 (2006.01)
G01M 15/12 (2006.01)
G01M 15/14 (2006.01)
G01H 1/10 (2006.01)

(52) U.S. Cl.
CPC ............ *G01H 1/10* (2013.01); *G01H 1/006* (2013.01); *G01M 15/12* (2013.01); *G01M 15/14* (2013.01); *G01R 31/343* (2013.01)

(58) Field of Classification Search
CPC .... G01R 31/343; G01M 15/12; G01M 15/14; G01H 1/10; G01H 1/006
USPC .......................................................... 73/650
See application file for complete search history.

(56) References Cited

U.S. PATENT DOCUMENTS

| 4,051,427 | A | * | 9/1977 | Kilgore | .................... | G06G 7/64 |
| | | | | | | 318/565 |
| 4,057,714 | A | * | 11/1977 | Fork | ........................ | F01D 21/00 |
| | | | | | | 702/34 |
| 4,302,715 | A | * | 11/1981 | Putman | ...................... | H02J 3/24 |
| | | | | | | 322/7 |
| 4,311,253 | A | * | 1/1982 | Putman | ..................... | H02H 7/06 |
| | | | | | | 322/100 |

(Continued)

FOREIGN PATENT DOCUMENTS

| CN | 87101640 A | 12/1987 |
| EP | 2565658 A1 | 3/2013 |

OTHER PUBLICATIONS

Internation Preliminary Report on Patentability Application No. PCT/EP2014/068973 Completed: Dec. 12, 2016 7 pages.

(Continued)

*Primary Examiner* — Jacques M Saint Surin
(74) *Attorney, Agent, or Firm* — Whitmyer IP Group LLC

(57) ABSTRACT

A monitoring device and a method for detecting mechanical torsional oscillations in a rotor shaft of a turbine-generator system. Specifically, the monitoring device and a method for detecting mechanical torsional oscillations in a turbine-generator system having a plurality of, such as two, three, four, five, six or more, turbines that are interconnected by means of a common turbine shaft.

17 Claims, 3 Drawing Sheets

(56) References Cited

U.S. PATENT DOCUMENTS

| | | | | |
|---|---|---|---|---|
| 4,329,637 A | * | 5/1982 | Kotake | H02P 9/10 322/20 |
| 4,331,882 A | | 5/1982 | Hingorani | |
| 4,733,340 A | | 3/1988 | Mase et al. | |
| 7,173,399 B2 | * | 2/2007 | Sihler | B60L 11/123 318/434 |
| 7,625,030 B2 | * | 12/2009 | Bieker | B60B 17/0006 188/33 |
| 8,056,417 B2 | * | 11/2011 | Markunas | H02P 9/10 73/649 |

OTHER PUBLICATIONS

International Search Report and Written Opinion of the International Searching Authority Application No. PCT/EP2014/068973 Completed: Jun. 9, 2015; dated Jun. 16, 2015 9 pages.

J. Hedberg and T. Bengtsson, "Straight Dielectric Response Measurements with High Precision", Nord-IS 2005, paper 27, ABB Corporate Research.

Massimo Bongiorno et al: "Online Estimation of Subsynchronous Voltage Components in Power Systems" IEEE Transactions on Power Delivery, IEEE Service Center vol. 23, No. 1, Jan. 1, 2008 (Jan. 1, 2008), pp. 410-418.

Richard G Farmer et al: "16 Power System Dynamic Interaction with Tu1 Speed Motor Controllers. Power System Stabilizers", May 14, 2007 (2007-URL:http:/1197.14.51.10:81/pmb/ELECTRONIOUE/ 05. Electric Power Ger 9291_C016.pdf [retrieved on Jul. 18, 2016].

T. Grandke, "Interpolation Algorithms for Discrete Fourier Transforms of Weighted Signals", IEEE Transactions on Instrumentation and Measurement, vol. IM-32, No. 2, pp. 350-353 (1983).

Written Opinion of the International Preliminary Examining Authority Application No. PCT/EP2014/068973 dated Jul. 25, 2016 6 pages.

Chinese Office Action, Application No. 2014800828284, Completed: Sep. 20, 2018, 2 Pages.

* cited by examiner

MONITORING TORSIONAL OSCILLATIONS IN A TURBINE-GENERATOR

TECHNICAL FIELD

The invention relates to a monitoring device and a method for detecting mechanical torsional oscillations in a rotor shaft of a turbine-generator system. Especially, the present invention relates to a monitoring device and a method for detecting mechanical torsional oscillations in a turbine-generator system having a plurality of, such as two, three, four, five, six or more, turbines that are interconnected by means of a common turbine shaft.

BACKGROUND

A long turbine shaft that interconnects several turbines, such as steam operated turbines, may suffer from torsional oscillations at one or more resonance frequencies of the shaft. Torsional resonance oscillations may lead to a breakdown of the turbine shaft and it is therefore necessary to avoid such oscillations and be able to detect them when they occur so that the torsional resonance oscillations or the turbines can be stopped. Torsional oscillations of the shaft at the rotor of the generator affects the electric power that is output from the generator and appear as variations in the current and voltage. Also, an electric power transmission system connected to the generator output terminals may induce electric energy to the shaft through the generator and thereby contribute to torsional oscillations in the turbine-generator shaft. Especially in electric transmission systems having reactive power compensation, the electrical transmission system may show resonance frequencies matching the resonance frequencies of the mechanical system so that the electric transmission system starts to interact with the torsional resonance oscillations of the shaft.

Different suggestions for counteracting torsional resonance oscillations can be found in the prior art, for example systems that monitors the generator output current to detect the torsional resonance oscillations.

U.S. Pat. No. 4,733,340 (Mase et al) describes a system for stabilizing torsional oscillations in a turbine-generator shaft. In this system, the output current of the generator is measured at the output terminals of the generator. From the torsional resonance frequency ($f_m$ in Mase et al) and the generator frequency ($f_1$ in Mase et al), a sub-synchronous and a super-synchronous resonance frequency of a current signal can be determined, which sub-synchronous and a super-synchronous resonance frequencies correspond to the resonance frequency of the torsional resonance oscillation. The sub-synchronous frequency ($f_1-f_m$ in Mase et al) component of the current and the super-synchronous frequency ($f_1+f_m$ in Mase et al) component of the current signal are filtered out by means of a respective, first and second, bandpass filter. The respective signal at the sub-synchronous frequency and the super-synchronous frequency is detected.

A drawback with using filters is that it is difficult to tune the filters correctly. A too wide bandpass filter will be sensitive to disturbances, whereas a narrow bandpass filter may not give accurate measurements of the magnitude if the resonance frequency is not known exactly, or if the filter cannot be tuned exactly.

Another drawback with such monitoring of the generator terminal currents is that the generator terminal currents varies with the impedance of the electric transmission system. Thus, variations within the electric transmission system may affect the current measurements, and the amplitude of the current frequencies may vary as a result of variations of the impedance of the electric transmission system.

U.S. Pat. No. 4,331,882 describes a system for detecting sub-synchronous and super-synchronous electrical signals in an electric power system. The electrical signals being used are current or voltage signals (col. 2, line 25-30 in U.S. Pat. No. 4,331,882). The obtained electrical signals are rectified and filtered by means of tuned filters. The filters are tuned to filter out the sub-synchronous and super-synchronous resonance components of the electrical signals. The filter detector provides an output that can be used to actuate an alarm and as input to a control circuit.

As mentioned in relation to U.S. Pat. No. 4,733,340 (Mase et al), a drawback with filtering out frequency components by means of a bandpass filters (as in U.S. Pat. No. 4,331,882) is that the filters need to cover a sub-band having a certain size since the torsional resonance oscillations may only be approximately known. There is a risk that other disturbances enter into such a sub-band and therefore will be detected as torsional resonance oscillations if the filters are not exactly tuned, while in fact these detected frequency disturbances will not cause harm to the shaft. Thus, there is a risk that the turbine-generator system is stopped when it is not necessary.

Moreover, the frequency of the generator terminal output current and voltage may vary slightly during operation since the frequency of the electric transmission network may vary. Thus, the sub-synchronous filter, for example, has to cover a certain extra bandwidth of the sub-synchronous frequency range and may therefore also register non-resonance signals as resonance signals.

The scientific paper "Online Estimation of Subsynchronous Voltage Components in Power Systems" (Bongiorno et al), IEEE Transactions on Power Delivery, vol. 23, no. 1, January 2008, describes methods for monitoring sub-synchronous components in the generator terminal voltage. The document discuss digital sampling of the generator voltage and detecting frequency variations that correspond to the torsional oscillations. The paper discuss detecting methods using digital FFT (Fast Fourier Transform) or Kalman filtering. Although such digital analysis may be more reliable than analogue bandpass filtering, there is a risk that a detected sub-synchronous frequency is not related to a torsional resonance oscillation, since the torsional resonance frequencies are only approximately known. Moreover, other disturbances of the frequency content may exist, for example as created by high power machines, such as for example an electric arc furnace in a steel production facility, which may create disturbances close to the torsional oscillation resonance frequencies.

Erroneously registering a signal as indicative of resonance may lead to a shutdown of the turbine-generator system when there is no need doing so. Shutting down a power production system is costly and should be avoided if it is not necessary.

Thus, there is a need to monitor torsional oscillation of a turbine-generator system with a high accuracy and reliability, so as not to unnecessarily shut down a power producing turbine-generator system.

SUMMARY

An aim of the invention is to overcome the drawbacks of the prior systems and provide a monitoring device, such as a monitoring and protection device, and a method for detecting torsional resonance oscillations at a high accuracy, and avoiding breakdown of a turbine-generator shaft as well as avoiding unnecessary shutdown of the energy production from a turbine generator system.

For this purpose, a first aspect of the present invention provides a method of detecting torsional resonance oscillations in a turbine-generator system, which turbine-generator system comprises a generator having output terminals connected to an electric transmission system, wherein the turbine-generator system provides electric power to the electric transmission system by means of the output terminals. The method comprises monitoring each of the voltages of the output terminals, and analyzing the frequency content of each voltage to detect torsional oscillations at a plurality of resonance frequencies of the turbine-generator system. The method is characterized in that for each resonance frequency the analyzing of the frequency content comprises:

identifying a first voltage peak in a sub-synchronous frequency sub-band, and a second voltage peak in a super-synchronous frequency sub-band, comparing the identified first voltage peak to the identified second voltage peak, and deducing from the comparison of the first and second voltage peak whether the turbine-generator system experience a torsional oscillation at the corresponding resonance frequency.

An advantage to use voltage measurements is that the voltage does not vary with the impedance of the electric transmission system and is directly proportional to the movement of the rotor of the generator. Thus the voltage is directly reflecting the amplitude of the torsional oscillation whereas the current reflect the power that is exciting, or de-exciting, the oscillation.

An advantage with monitoring also super-synchronous sub-bands is that the identification of the resonance oscillations will be more accurate. Each sub-synchronous resonance frequency is mirrored by the electric frequency of the electric transmission system at the super-synchronous resonance frequency. Monitoring this super-synchronous resonance frequency provides a more dependable and secure indication of torsional resonance oscillations.

It should be noted that sub-synchronous and super-synchronous resonance voltage peaks are small compared to the generator terminal voltage, about a $1/1000$ of the terminal voltage. Corresponding current peaks are usually larger, about $1/100$ of the terminal current. An embodiment of the method includes monitoring the generator terminal current in addition to the generator terminal voltage, and also includes analyzing the current in order to detect torsional resonance oscillations.

In an embodiment, the method includes determining the frequency of the first voltage peak by determining the position of the first voltage peak within the sub-synchronous frequency sub-band, and determining the frequency of the second voltage peak by determining the position of the second voltage peak within the super-synchronous frequency sub-band.

This is different from analog prior art systems, wherein the current is filtered in a narrow sub-band surrounding the sub-synchronous resonance frequency, and the amplitude of, or energy content within, that narrow sub-band is used as an indication for resonance. An advantage with determining the positions within the sub-bands is that it provides a higher accuracy than merely detecting a signal within the sub-band. Thus, analyzing the frequency content is a way to determine the respective frequencies of the voltage peaks exactly, in contrast to the prior systems that do not determine the frequencies, but merely detects a signal strength within a sub-band surrounding a sub- or super-synchronous resonance frequency.

The present invention preferably includes a digital evaluation of the voltage signal, using for example an FFT-transform, to identify the exact position of the voltage peak within each narrow sub-band surrounding each sub- or super-synchronous resonance frequency, so that the position of the voltage peak within the narrow sub-band, i.e. the exact frequency of the peak, is determined.

Preferably also, the method includes determining the distance of each of the determined positions to the fundamental frequency of the generator terminal output voltage.

In an embodiment, the comparing of the first and second voltage peak includes determining whether the determined frequency of the first voltage peak in the sub-synchronous frequency sub-band, is mirrored on the opposing side of the generator fundamental frequency by the determined frequency of the second voltage peak in the super-synchronous frequency sub-band. An advantage of determining the mirroring is that such mirroring confirm that the peaks in the sub-synchronous and super-synchronous frequency sub-band really corresponds to a torsional resonance oscillation of the turbine shaft.

As indicated in the foregoing, a sub-synchronous resonance frequency is found at the same "distance" from the generator fundamental voltage frequency as the corresponding super-synchronous frequency.

In an embodiment, the method includes determining the amplitude of each voltage peak, and may also include determining the amplitude of current peaks.

The amplitude of a voltage peak at a sub-synchronous resonance frequency, and the amplitude of a voltage peak at a super-synchronous resonance frequency, is proportional to the torsional oscillation of the shaft at the generator. These voltage amplitudes are also proportional to their respective frequency.

Thus, an advantage with determining the amplitude of the voltage peaks are that these amplitudes gives an indication of the amplitude of the torsional oscillation of the shaft. Amplitudes of current peaks relate to the power into, or out of, the resonance oscillations and varies with the properties (especially the reactance) of the electric power system. Thus, currents are a secondary indication of torsional oscillations whereas voltages are more direct.

In an embodiment, the deducing of whether the turbine-generator system experience a torsional oscillation at the corresponding resonance frequency includes establishing that the ratio between the amplitude of the first voltage peak and the amplitude of the second voltage peak, is essentially equal to the ratio between the frequency of the first voltage peak and frequency of the second voltage peak. Preferably, the determined frequencies are used when establishing the correspondence between the ratios.

In an embodiment, the method includes monitoring the current and identifying current peaks within narrow bands around each sub-synchronous resonance frequency and identifying peaks within narrow bands around each corresponding super-synchronous resonance frequency.

A frequency analysis of the current may be used to confirm the frequency analysis of the voltage.

The invention can be employed for protecting a turbine-generator.

In an embodiment, the method includes performing an action if a torsional resonance oscillation is detected, which action preferably includes at least one of the following actions:

a) sending a message to a transmission system operator (TSO) of the electric transmission system, in order to change the properties (e.g. reactance) of the electric transmission system, for example by bypassing a transmission line series capacitor, connecting an additional transmission line, or changing controlling parameters in a nearby FACTS or TSCS device, and b) sending an alarm message to a generator controller in order to change the operating conditions of the generator or, as a last resort, disconnect the turbine-generator from the electric transmission system.

According to a second aspect, the present invention provides a monitoring device for detecting torsional resonance oscillations in a turbine-generator system that comprises a generator having output terminals for feeding generated electric power to an electric transmission system. The monitoring device comprises:

input means for receiving voltage signals representing the voltages of the output terminals, and a control unit configured to perform a digital analysis of the frequency content of received voltage signals to detect torsional oscillations at a plurality of resonance frequencies of the turbine-generator system. The control unit of the monitoring device is configured, for each resonance frequency, to identify a first voltage peak in a sub-band surrounding the subsynchronous resonance frequency that corresponds to the resonance frequency, identify a second voltage peak in a sub-band surrounding the super-synchronous resonance frequency that corresponds to the resonance frequency. The control unit is configured especially to:

determine the frequency of the first voltage peak by determining the position of the first voltage peak within the sub-band that surrounds the subsynchronous resonance frequency;

determine the frequency of the second voltage peak by determining the position of the second voltage peak within the sub-band that surrounds the super-synchronous resonance frequency;

compare the determined frequency of the first voltage peak to the determined frequency of the second voltage peak, and based on the result of the comparison of the determined frequencies to:

deduce whether the turbine-generator system experience a torsional oscillation at the resonance frequency.

In an embodiment, the comparison of the determined frequencies establish whether the determined frequency of the first voltage peak is mirrored by the main frequency of the voltage signal at the determined frequency of the second voltage peak.

In an embodiment, the control unit is configured to:
determine the amplitude of the first voltage peak;
determine the amplitude of the second voltage peak;
compare the determined amplitudes of the first and second voltage peak, and
based on the result of the comparison of the determined frequencies and on the result of the of the comparison of the determined amplitudes to
deduce whether the turbine-generator system experience a torsional oscillation at the resonance frequency.

In an embodiment, the comparison of the determined amplitudes establish whether the ratio between the amplitude of the first voltage peak and the amplitude of the second voltage peak is equal to the ratio between the determined frequency of the first voltage peak and the determined frequency of the second voltage peak.

In an embodiment, the monitoring device comprises an output unit for transmitting messages, wherein the control unit is configured to:

transmit an alert message, by means of the output unit, when a torsional resonance oscillation is detected, which alert message is transmitted to a controller of the electrical transmission system, or a generator controller of the turbine-generator system.

The monitoring device can be implemented in a protective device.

In an embodiment, the input means of the monitoring device is adapted for receiving current signals representing the currents of the output terminals, wherein the control unit is adapted to perform a digital analysis of the frequency content of received current signals, is adapted to identify current peaks within narrow bands surrounding each subsynchronous resonance frequency and identifying peaks within narrow bands surrounding each corresponding super-synchronous resonance frequency, and is adapted to deduce whether the turbine-generator system experience a torsional oscillation at the resonance frequency from the comparison of the voltage peaks as well as from the frequency analysis of the current signals.

Analyzing both the voltage and the currents enhances the accuracy of determining torsional resonance oscillations even further.

Preferably, for each resonance frequency, the control unit is adapted to determine the frequency of a first current peak within the sub-band that surrounds the subsynchronous resonance frequency; determine the frequency of a second current peak within the sub-band that surrounds the super-synchronous resonance frequency; and compare the determined frequency of the first current peak to the determined frequency of the second current peak, and use the result of the comparison of the determined frequencies of the current peaks when deducing whether the turbine-generator system experience a torsional oscillation at the resonance frequency.

DETAILED DESCRIPTION

Figure 1:
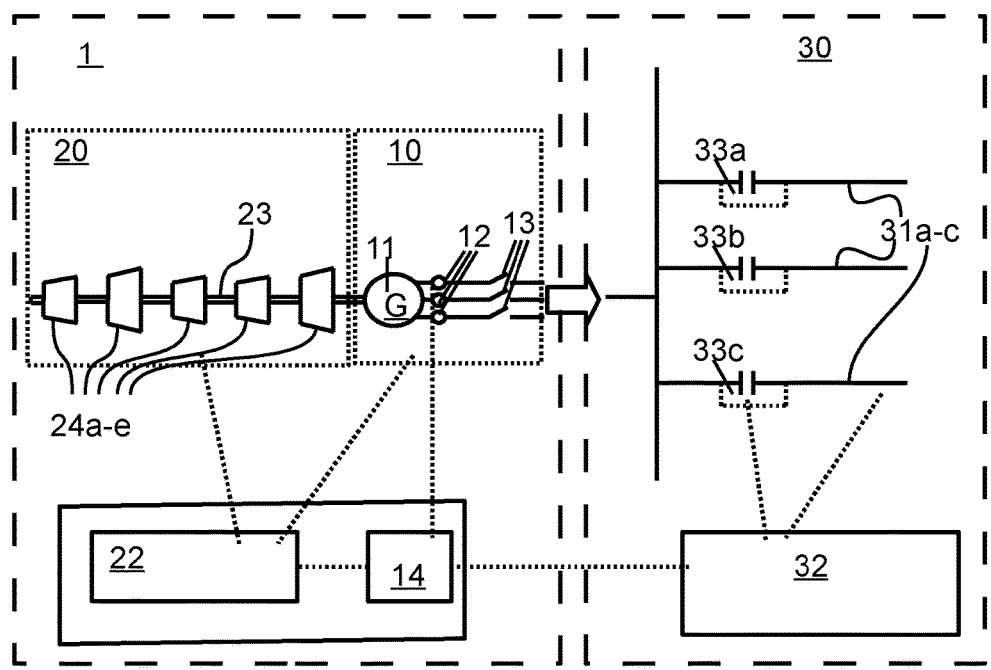
FIG. 1 illustrates a turbine-generator system connected to an electric transmission system, which turbine-generator system includes a monitoring device in accordance with an embodiment of the invention.

FIG. 1 illustrates a turbine-generator system 1 connected to an electric transmission system 30. The turbine-generator system 1 has a mechanical side 20 comprising a plurality of turbines 24a-e for harnessing energy from for example a steam generator, and an electro-mechanical side 10 for transforming rotational energy into electrical energy and feeding the electrical energy to the electric transmission system 30 by means of generator breakers 13. The turbine-generator system 1 comprises a generator 11, a shaft 23 and the plurality of turbines 24a-e. A rotor of the generator 11 and the turbines 24a-e are connected to the shaft 23. The generator 11 comprises three output terminals 12 connected to an electric transmission system 30, wherein the turbine-generator system 1 provides electric power to the electric transmission system 30 by means of the output terminals 12. Note that, for clarity of the figure, the generator 11 is illustrated with one output terminal 12 for each of three phases, whereas only one of the three phases is illustrated in the electric transmission system 30. The turbine-generator system 1 also comprises a generator controller 22 that controls the generator 11 and the energy production of the turbines 24a-e, such as steam operated turbines. The turbine-generator system 1 also includes a monitoring device 14 for detecting torsional oscillations in the shaft 23, which monitoring device 14 is connected to voltage sensors (not shown) arranged at the output terminals 12 of the generator 11, which voltage meters are arranged to measure the terminal voltages and provide voltage signal, which represents the output terminal 12 voltage, to the monitoring device 14. The monitoring device 14 is configured to detect the torsional oscillations by means of analyzing the voltage signals obtained by the voltage meters. The monitoring device 14 may also be configured for receiving current signals obtained by current meters (not shown) arranged at the output terminals 12, and may be configured for using the current signals to detect torsional oscillations. The monitoring device 14 is illustrated as a separate device, but may be integrated into the generator controller 22.

The electric transmission system 30 comprises transmission lines 31a-c, capacitor devices 33a-c, and a controller 32 for a transmission system operator (TSO). The capacitor devices 33a-c are illustrated as series-connected capacitors that can be by-passed by the TSO, but the electric transmission system 30 may also include other controllable capacitor devices 33a-c, such as FACTS (Flexible AC Transmission System) or TCSC (Thyristor-Controlled Series Capacitors) devices. The monitoring device 14 is communicatively connected to the generator controller 22 and to the TSO controller 32, and is configured to transmit messages to the generator controller 22 and the TSO controller 32 upon detecting torsional resonance oscillations in the shaft 23.

The monitoring device 14 is configured to perform a digital analysis of the voltage signals and, preferably also, the current signals, to deduce whether the shaft 23 experience torsional resonance oscillations that, via the generator 11, interact with the electric transmission system 30. Especially, the monitoring device is configured to perform an analysis of the frequency content of the voltage signals. In a preferred embodiment, the monitoring device 14 is configured to transform a sampled voltage signal by means of FFT (Fast Fourier Transform) into the frequency domain and to perform an analysis of the frequency content of the voltage. A suitable digital process for the frequency analysis by means of a Fourier Transform is discussed in "J. Hedberg and T. Bengtsson, Straight Dielectric Response Measurements with High Precision, Nord-IS 2005, paper 27". The digital processing (see chapter 2.2 in "J. Hedberg, T. Bengtsson") provides complex amplitudes and corresponding frequencies of the analyzed signal as output. Long records are sampled in this digital processing method as this increase the sensitivity for weak signals and the frequency resolution. Interpolation techniques are then used to find accurate estimates of the frequency and complex amplitude of any peak in the FFT spectrum. It is preferred that such a digital Fourier Transform processing is employed when performing the invention, wherein long records of the analyzed signal are sampled and interpolation is used to find amplitudes and frequencies of the sub- and supersynchronous peaks. Thus it is preferred that a so called interpolated FFT (iFFT) is used, including sampling long records and outputting complex amplitudes and their corresponding frequencies.

Interpolated FFT is described in, for example, T. Grandke, Interpolation Algorithms for Discrete Fourier Transforms of Weighted Signals, IEEE trans. on inst. and meas. vol. IM-32, no. 2, p 350 (1983).

The monitoring device 14 is further configured to identify those voltage peaks in the frequency content, which correspond to torsional resonance oscillations of the shaft 23, i.e. which voltage peaks are found at the sub-synchronous resonance and super-synchronous resonance frequencies. The monitoring device 14 is further configured to deduce whether identified peaks indicate any torsional resonance oscillations, and, if so, take action for counteracting and eliminating the torsional resonance oscillations. The monitoring device 14 is configured to take action by transmitting messages indicating torsional resonance oscillations to the generator controller 22 and the TSO controller 32, and may also produce an output or alarm on an integrated, or external, monitor display and/or loudspeaker.

Upon receiving a message that indicates torsional resonance oscillations, the TSO controller 32 may for example
- bypass one or more of the capacitor devices 33a-c,
- connect one or more transmission lines 31a-c, or
- change control parameters or operating mode of a FACTS device or a TSCS device Upon receiving a message that indicates torsional resonance oscillations, the generator controller 22 may for example close steam valves that feed the turbines 24a-c and stop the turbines 24a-c, and open circuit breakers of the generator 11 and disconnect the generator 11 from the electric transmission system 30.

An embodiment of the monitoring device 14 will be further described with reference to FIG. 4. The analysis of the frequencies of the voltage signal, which is performed by the monitoring device 14 is described further in the following with reference to FIG. 2.

Figure 2:
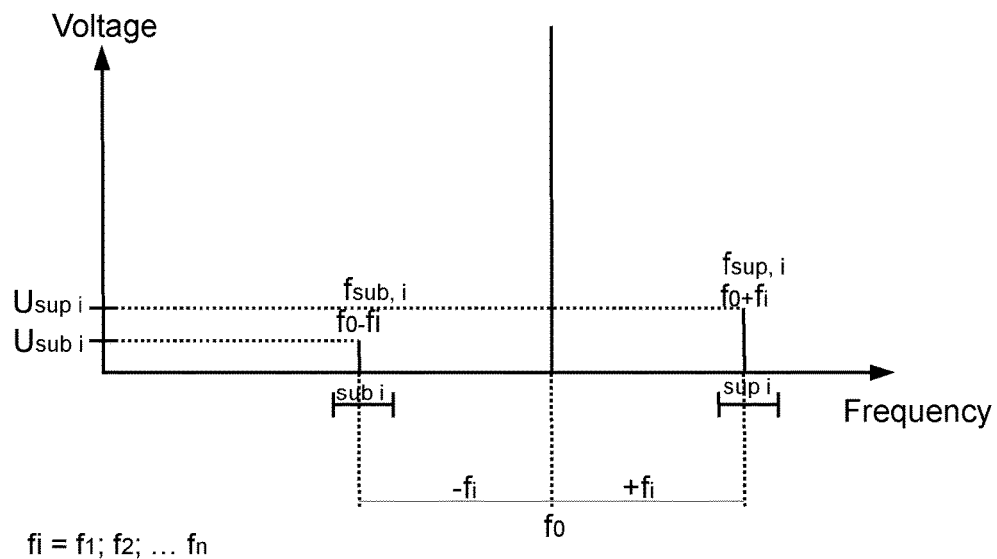
FIG. 2 illustrates a frequency spectra for describing the functioning of the monitoring device of the invention.

FIG. 2 illustrates voltage peaks in voltage signal from a generator 11 output terminal 12 at different frequencies, and how these voltage peaks are identified. The generator fundamental frequency is normally about 50 Hz in Europe, and about 60 Hz in the US. The main frequency $f_0$ of the voltage signal is found at the generator fundamental frequency, i.e. usually approximately 50 Hz or 60 Hz. For illustrative purposes, FIG. 2 only illustrate how one resonance frequency $f_i$ of the resonance frequencies $f_1$-$f_n$, appear as two voltage peaks in the output terminal 12 voltage. Thus, two voltage peaks created by the resonance frequency $f_i$ appear. The sub-synchronous resonance frequency $f_{sub\ i}$ that corresponds to the resonance frequency $f_i$, of the mechanical torsional oscillations, has a frequency equal to $f_0$−$f_i$. The super-synchronous resonance frequency $f_{sup\ i}$ that corresponds to the resonance frequency $f_i$ has a frequency equal to $f_0$+$f_i$. In general, for each frequency $f_i$ of the resonance frequencies $f_1$-$f_n$, two voltage frequencies are created by the resonance frequency $f_i$, a sub- and super-synchronous resonance frequency ($f_{sub,\ i}$ and $f_{sup,\ i}$ respectively) that is equal to $f_0$−$f_i$ and $f_0$+$f_i$, respectively.

In more detail; with torsional vibrations present, the rotational frequency of the rotor shaft is no longer constant but oscillates with an amplitude f:

$$f(t)=f_0+f\cos(2\pi f_i t) \qquad \text{(eq. 1)}$$

For small values of f, the voltage induced in the generator stator winding can then be derived as:

$$U(t) = U_0 \left[ \cos(2\pi f_0 t) + \frac{f}{4\pi f_0 f_i} \left[ (f_0 + f_i)\cos(2\pi (f_0 + f_i)t) - (f_0 - f_i)\cos(2\pi (f_0 - f_i)t) \right] \right]$$ (eq. 2)

Thus two new frequencies, $f_0 \pm f_i$, appear with relative amplitudes directly proportional to the frequency.

When searching for these sub- and super-synchronous frequencies, the monitoring device 14 is configured to search in a narrow sub-band $sub_i$, $sup_i$ that surrounds the respective sub- and super-synchronous frequency; $f_{sub,i}$ and $f_{sup,i}$. The monitoring device 14 is also configured to determine the position, i.e. the exact frequency, of each voltage peak that are found in the sub- and super-synchronous frequency sub-bands $sub_i$, $sup_i$. By determining the sub-synchronous frequency $f_{sub\ i}$ and the super-synchronous frequency $f_{sup\ i}$ and comparing these determined frequencies, an accurate detection can be made of whether the corresponding voltage peaks correspond to torsional resonance oscillations or not, so that it can be deduced if the electrical transmission system 30 interacts with, and excites oscillations in, the shaft 23 of the turbine generator system 1.

To determine if the peaks found in each sub-band $sub_i$, $sup_i$ corresponds to a resonance frequency $f_i$, the monitoring device 14 is configured to check that the voltage peak in the sub-synchronous frequency sub-band $sub_i$ is found at the same distance from the from the generator fundamental frequency $f_0$ as the distance from the voltage peak in the super-synchronous frequency sub-band $sup_i$ to the generator fundamental frequency $f_0$. The sub-synchronous resonance frequency and the super-synchronous resonance frequency is found at a distance of $f_i$ Hz from the fundamental frequency $f_0$. For example, each sub-synchronous resonance frequency voltage peak should be found at $f_0-f_i$ and the monitoring device 14 may therefore calculate each resonance frequency $f_i$ when the position of the voltage peak in sub-synchronous resonance frequency sub-band $sub_i$ that surrounds $f_{sub,i}$ has been determined. The monitoring device 14 may subsequently use the calculated $f_i$ to calculate where a voltage peak should appear in the sub-band $sup_i$ that surrounds the super-synchronous resonance frequency $f_{sup,i}$. If the calculated position of the voltage peak in the super-synchronous sub-band $sup_i$ that surrounds the super-synchronous resonance frequency $f_{sup,i}$ is equal to the position that has been determined for the voltage peak within the super-synchronous resonance frequency sub-band $sup_i$, then the voltage peaks found in the sub-synchronous frequency sub-band $sub_i$ and in the super-synchronous frequency sub-band $sup_i$ indicate a torsional resonance oscillation having a frequency $f_i$.

Moreover, the magnitude of each voltage peak that correspond to a torsional resonance oscillation is proportional to the amplitude of the torsional resonance oscillation in question at the generator 11. The monitoring device 14 is configured to estimate the magnitude of a torsional resonance oscillation from the corresponding voltage peaks.

Calculating torsional resonance frequencies $f_i$ and the corresponding torsional resonance oscillation modes of a turbine-generator system 1 is a practice known within the field of mechanical dynamics, and it is appropriate to determine the oscillation modes and resonance frequencies of the turbine-generator system 1 that should be monitored by the monitoring device 14 in advance. The monitoring device 14 is suitably configured with parameters that are specific for the turbine-generator system in question.

A general introduction of the subject of subsynchronous oscillations and the correspondence between electrical measurements and mechanical torsional oscillations can be found in "Power System Stability and Control" by Prabha Kundur, McGraw Hill Inc. (1994).

The monitoring device 14 is further configured to use thresholds for the voltage peaks, and is configured to apply a specific action for each threshold. The final action may for example be shutting down the power production of the turbine-generator system 1 by sending an alarm message to the generator controller 22, and/or a control signal to the generator breakers 13. However, to avoid unnecessary shutdown of the energy production, the monitoring device 14 is configured to use lower thresholds for messaging the TSO controller 32, and use lower thresholds for messaging the generator controller 22, to take further action before a shutdown is necessary.

Due to the differences of the torsional oscillation resonance modes, the severeness of a voltage peak at a specific level can be determined. Therefore, the monitoring device 14 should be configured to use different thresholds for different resonance frequencies.

Moreover, the monitoring device 14 is configured to determine the time period that a voltage peak has been above each threshold, for example by starting a respective timer when reaching a threshold, and measuring the time period above the threshold. The monitoring device 14 is further configured to use a respective criterion for each combination of a voltage peak level threshold and time period threshold, for selecting the action that should be taken. The monitoring device 14 is configured to use different criteria for combinations of voltage peak levels and time periods, which criteria could be determined from a stress analysis of the shaft 23 of the turbine-generator when experiencing the different torsional oscillation resonance modes.

Moreover, the amplitude, or magnitude, of each voltage peak that correspond to a torsional oscillation resonance is proportional to the frequency (of the voltage peak). The monitoring device 14 is configured to use the relation of the magnitude of a sub-synchronous voltage peak and the magnitude of the corresponding super-synchronous voltage peak to deduce whether the identified voltage peaks correspond to torsional resonance oscillations by using both the magnitudes of the voltage peaks and their respective frequencies when comparing the voltage peaks. Comparing the magnitudes of the voltage peaks makes it possible to provide an accurate deduction of whether the voltage peaks really do indicate torsional resonance oscillations or not. The comparing of the magnitudes can be performed in addition to, or as an alternative to, the comparison of the determined frequencies of the voltage peaks. Two such magnitudes $U_{sub,\ i}$ and $U_{sup,\ i}$ are indicated in FIG. 2. The magnitude of the sub-synchronous voltage peak $U_{sub\ i}$ should be proportional to the torsional oscillation amplitude and to the frequency $f_{sub\ i}$ (which equals $f_0-f_i$), and the magnitude of the super-synchronous voltage peak $U_{sub\ i}$ should be proportional to the torsional oscillation amplitude and to the frequency $f_{sup\ i}$ (which equals $f_0+f_i$).

Thus, the ratio $U_{sup,i}/U_{sub,i}$ between the super- and the sub-synchronous voltage peaks should be equal to the ratio $f_{sup,i}/f_{sub,i}$ between the super-synchronous frequency and the sub-synchronous frequency, which is equal to $(f_0+f_i)/(f_0-f_i)$.

The monitoring device 14 may be configured to deduce whether identified peaks correspond to torsional resonance oscillations by comparing the ratio between the super- and sub-synchronous voltage peak amplitudes $U_{sup,i}$, $U_{sub,i}$ with the ratio between the super-synchronous and sub-synchronous frequencies (possibly $f_{sup,i}$, $f_{sub,i}$).

Figure 3:
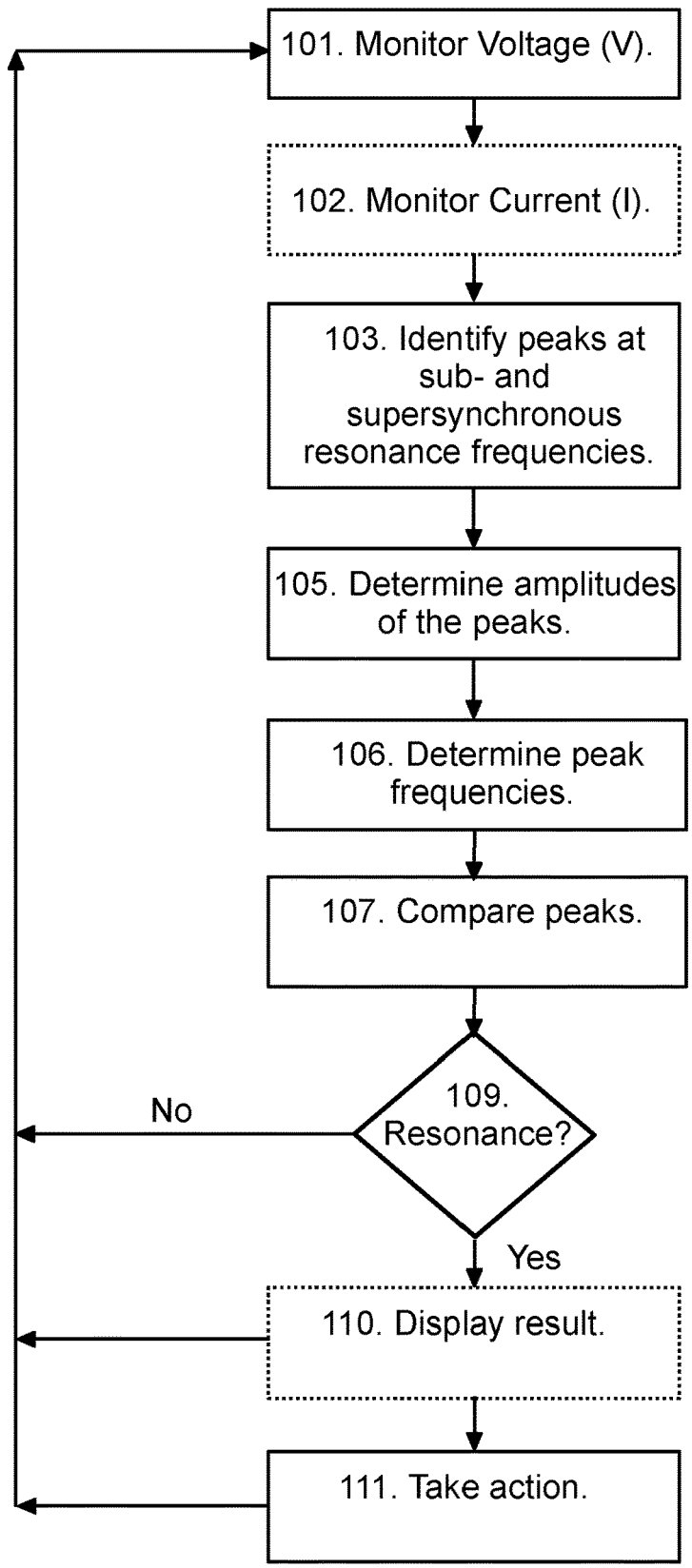
FIG. 3 illustrates a method of monitoring torsional resonance oscillations in accordance with embodiments of the invention.

The described functioning of the monitoring device 14 is summarized in FIG. 3, which illustrates a method for detecting torsional resonance oscillations. An embodiment of a monitoring device 14 that is configured for performing the method of FIG. 3 will be described in relation to FIG. 4.

The method for monitoring torsional oscillations of a turbine-generator system 1 of FIG. 3 starts with monitoring 101 the voltages at the output terminals 12 of the generator 11. The method may also include monitoring 102 the currents at the output terminals 12.

The method continues with performing a number of analyses of the frequency content (steps 103-109) of the voltages to detect torsional resonance oscillations at a plurality of resonance frequencies $f_1$-$f_n$ of the turbine-generator system 1. For each resonance frequency $f_i$ of the resonance frequencies $f_1$-$f_n$ that are analyzed, the steps performed are the same.

The method includes identifying 103 a first voltage peak in a sub-synchronous resonance frequency sub-band $sub_i$, and a second voltage peak in a super-synchronous resonance frequency sub-band $sup_i$, for each analyzed resonance frequency $f_i$.

The identifying 103 may include starting a timer for each identified voltage peak, so that time period elapsed since a voltage peak were detected are made available. A timer may alternatively be started during any other of the method steps, for example in step 109 or step 111.

If the output terminal 12 currents are monitored, the identifying 103 includes also identifying 103 current peaks within narrow sub-bands around each sub-synchronous resonance frequency and identifying 103 current peaks within narrow sub-bands around each corresponding super-synchronous resonance frequency.

The method continues with determining 105 the amplitude of each voltage peak, i.e. the first voltage peak in the sub-synchronous frequency sub-band ($sub_i$), and the second voltage peak in the super-synchronous frequency sub-band ($sup_i$).

The method continues with determining 106 the frequency of each voltage peak. Each frequency is determined as exactly as possible, and the determined frequency may be used to correct the value of the corresponding resonance frequency.

The determining 106 of the voltage peaks that is made for each resonance frequency $f_i$ includes determining the frequency (possibly at $f_{sub,i}$) of the sub-synchronous voltage peak by determining the position of the voltage peak within the sub-synchronous frequency sub-band $sub_i$, and determining 106 the frequency (possibly at $f_{sup,i}$) of the super-synchronous voltage peak by determining the position of the voltage peak within the super-synchronous frequency sub-band $sup_i$.

The method continues with comparing 107 the identified sub-synchronous voltage peak that corresponds to the analyzed resonance frequency $f_i$ to the identified super-synchronous voltage peak that corresponds to the analyzed resonance frequency $f_i$.

The comparing 107 of the sub-synchronous voltage peak and the super-synchronous voltage peak includes determining whether the determined sub-synchronous frequency is located at the same distance, but in opposite direction, to the generator fundamental frequency as the determined super-synchronous frequency. Thus, the determining 107 includes establishing that the sub-synchronous frequency is mirrored by the generator fundamental frequency at the super-synchronous frequency (possibly at $f_{sup,i}$).

If the frequencies are mirrored it can be deduced (109) that the determined frequencies are the sub-synchronous resonance frequency $f_{sub,i}$ and the super-synchronous resonance frequency $f_{sup,i}$ that corresponds to the analyzed resonance frequency $f_i$ of the turbine-generator system 1.

Thus, the method continues with deducing 109 whether the identified voltage peaks indicate a torsional resonance oscillation in the shaft 23 of the turbine-generator system 1 at the corresponding resonance frequency $f_i$.

The deducing 109 of whether the turbine-generator system 1 experience a torsional resonance oscillation at the resonance frequency $f_i$ may also include determining the ratio of the amplitude $U_{sub,i}$ of the sub-synchronous voltage peak and the amplitude $U_{sup,i}$ of the super-synchronous voltage peak. The deducing also includes determining the ratio between the frequency ($f_{sub,i}$) of the sub-synchronous voltage peak and frequency ($f_{sup,i}$) of the super-synchronous voltage peak. These two ratios should be essentially equal if the turbine-generator system 1 experiences a torsional resonance oscillation. Thus, the deducing establishes whether the ratio of the amplitudes and the ratio of the frequencies are essentially equal.

If no torsional resonance oscillations can be detected, the method continues with monitoring 101 the generator terminal 12 voltages.

If torsional resonance oscillations can be established, the method preferably takes action by alerting 110 the result to an operator by means of a display and/or a loudspeaker. The method continues the monitoring after outputting the result to the operator and also takes further actions (in 111).

The process of taking action 111 includes actions to change the electrical characteristics of the electric transmission system 30 and/or actions for regulating the turbine-generator system 1. The regulating of the turbine-generator system 1 may include controlling the magnetization current of the generator to counteract the interaction between the electric transmission system 30 and the turbine-generator system 1 at any of the resonance frequencies $f_1$-$f_n$. Preferably, the process of taking action includes at least one of the following actions:

a) sending a message to a transmission system operator of the electric transmission system 30, in order to change the properties of the electric transmission system, and b) sending a message to a generator controller 22 in order to change the control properties of the turbine-generator system 1, or sending an alarm message to the generator controller 22, in order to disconnect the turbine-generator system 1 from the electric transmission system 30.

The process 111 of taking action may also consider the time elapsed from when a voltage peak has identified. Thus, the process 111 of taking action may include selecting an action based on the elapsed time, and upon reaching a first time threshold:

sending a message to the transmission system operator of the electric transmission system 30 to change the properties of the electric transmission system, and upon reaching a second time threshold:

sending an alarm to the generator controller 22 of the turbine-generator system 1 to shut-down the turbine-generator system 1. Preferably, the first time threshold is smaller than the second time threshold.

The process 111 of taking action may include selecting an action based on the elapsed time, and upon reaching a third time threshold:
sending a message to the generator controller 22 of the turbine-generator system 1 to change the control properties of the turbine-generator system 1, and upon reaching the second time threshold:
sending an alarm to the generator controller 22 of the turbine-generator system 1 to shut-down the turbine-generator system 1. Preferably, the third time threshold is smaller than the second time threshold.

The process 111 of taking action may be based on the time elapsed from when a voltage peak has been identified and on the amplitude of the voltage peak. Thus, the process 111 of taking action may include selecting actions based on the elapsed time and the amplitude, which actions are selected upon fulfilling criteria that include a combination of an amplitude threshold and elapsed time threshold. The criteria may also be dependent on operating conditions of the electric transmission system and/or the operating conditions if the turbine-generator system 1.

Figure 4:
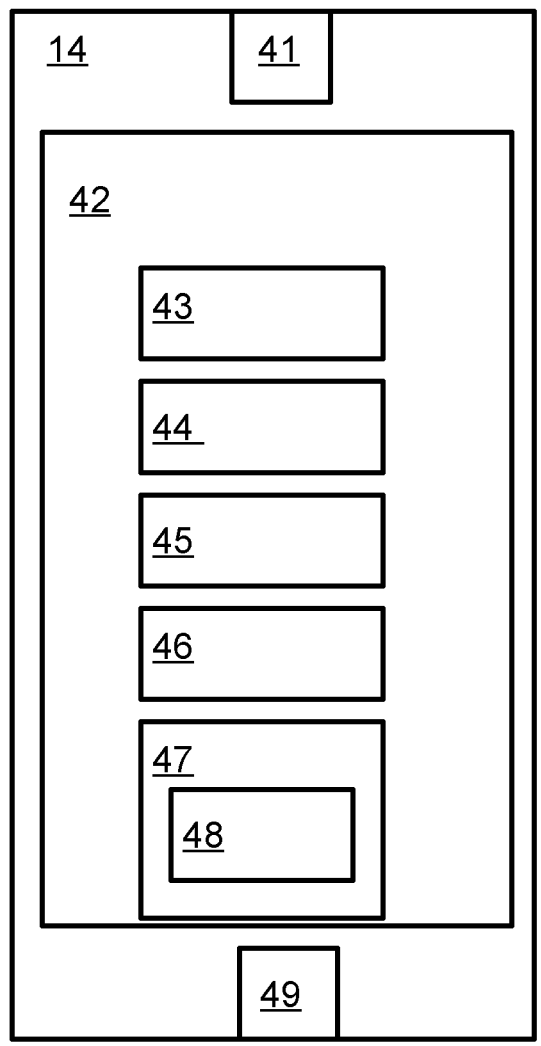
FIG. 4 illustrates an embodiment of a monitoring device according to the invention.

FIG. 4 illustrates an embodiment of a monitoring device 14. The monitoring device 14 comprises an input 41 for receiving voltage signals, a controller or control unit 42, and an output unit 49 such as a communication interface for transmitting messages. The input 41 may be adapted for receiving current signals in addition to the voltage signals. The monitoring device 14 may also comprise an output for a display or a loudspeaker.

The monitoring device 14 is a computer unit comprising processor and memory, but is illustrated in FIG. 4 by functional units 42-48 that are combinations of hardware and software for performing the functions of the monitoring device 14, which functions has been described with reference to FIGS. 1-3. The control unit 42 comprises:
a peak identifier 43 for identifying voltage peaks;
an amplitude determiner 44 for determining the amplitudes of the voltage peaks;
a frequency determiner 45 for determining the frequencies of the voltage peaks;
a comparing unit 46 for comparing a voltage peak in a subsynchronous sub-band to a voltage peak in corresponding a super synchronous sub-band, and
a decision unit 47 for deducing whether a torsional resonance oscillation of the turbine-generator system 1 has been detected, which decision unit 47 comprises a timer 48 for measuring the time from when a voltage peak that indicates a torsional resonance oscillation has been identified.

The control unit 42 is configured to perform an analysis of the frequency content of a received voltage signal. The peak identifier 43 is configured to identify voltage peaks in the received voltage signal, by identifying voltage peaks in pairs of subsynchronous resonance frequency and supersynchronous resonance frequency $f_{sub,i}$, $f_{sup,i}$ sub-bands $sub_i$, $sup_i$ each pair corresponding to a respective resonance frequency $f_i$ of the turbine-generator system 1.

The amplitude determiner 44 is configured to determine the amplitudes $U_{sub,i}$, $U_{sup,i}$ of the identified voltage peaks.

The frequency determiner 45 is configured to determine the respective frequency of each voltage peak that has been identified in the sub-bands $sub_i$, $sup_i$ that surrounds a respective sub- or super-synchronous resonance frequency $f_{sub,i}$, $f_{sup,i}$.

The comparing unit 46 is configured to compare voltage peaks that have been identified in the respective pairs of sub-bands $sub_i$, $sup_i$, that correspond to a specific resonance frequency $f_i$. The comparing unit 46 is adapted to make a comparison of the voltage peaks on the basis of the determined frequencies of the voltage peaks. The comparing unit 46 is also adapted to make a comparison of the voltage peaks on the basis of the determined amplitudes $U_{sub,i}$, $U_{sup,i}$ of the voltage peaks.

The decision unit 47 is configured to deduce whether the turbine-generator system 1 experience a torsional resonance oscillation if the comparison of the determined frequencies indicates that the determined frequencies are the subsynchronous and the supersynchronous resonance frequencies $f_{sub,i}$, $f_{sup,i}$ that correspond to the resonance frequency $f_i$ of any of the torsional resonance oscillation modes of the turbine-generator system 1. The decision unit 47 is also configured to take an appropriate action when it detects a torsional resonance oscillation, and to select action based on the determined amplitudes $U_{sub,i}$, $U_{sup,i}$ of the voltage peaks. Moreover, the decision unit 47 is also configured to select action on the basis of the time period that the turbine-generator system 1 has experienced a torsional resonance oscillation. To determine the time period, the decision unit 47 includes the timer 48 for measuring the time of a torsional resonance oscillation, and the decision unit 47 is adapted to start measuring the time by means of the timer 48 every time it detects a torsional oscillation at any $f_i$ of the resonance frequencies.

The decision unit 47 is configured to perform the selected action by means of the output unit 49, such as transmitting an alerting message to the transmission system operator of the electrical transmission system 30, or to a generator controller of the turbine generator system 1.

Each unit 42-47 may be further adapted to perform its functions in accordance with the functions of the embodiments of the monitoring device 14 that has been described with reference to FIGS. 1-3.

A monitoring device and a method for detecting torsional oscillations of a turbine-generator system 1 has been described with embodiments illustrated in the figures. The invention is however not limited to these embodiments, but may be varied within the scope of the claims. The embodiments of the illustrated method comprises monitoring 101 each of the voltages of output terminals 12 of the turbine-generator system 1, and analyzing 103-109 the frequency content of each voltage. For each monitored resonance frequency $f_i$ of the turbine-generator system 1, the analyzing comprises
identifying 103 a first voltage peak in a sub-synchronous frequency sub-band $sub_i$, and a second voltage peak in a super-synchronous frequency sub-band $sup_i$,
comparing 107 the first voltage peak to the second voltage peak, and
deducing 109 from the comparison whether the turbine-generator system 1 experience a torsional oscillation at the resonance frequency $f_i$.

The illustrated embodiments of the monitoring device 14 comprises input means 41 for receiving voltage signals representing the voltages of the output terminals 12, and a control unit 42 configured to perform a digital analysis of the frequency content of the voltage signals. The illustrated embodiments of the control unit 42 is configured to:
identify a first voltage peak in a sub-band $sub_i$ surrounding a subsynchronous resonance frequency $f_{sub,i}$;
identify a second voltage peak in a sub-band $sup_i$ surrounding a super-synchronous resonance frequency $f_{sup,i}$;
determine the frequency of the first voltage peak;
determine the frequency of the second voltage peak
compare the frequency of the first voltage peak to the frequency of the second voltage peak, and based on the comparison deduce whether the turbine-generator system 1 experience a torsional oscillation at any resonance frequency $f_i$.

The invention claimed is:

1. A method for monitoring torsional oscillations of a turbine-generator system, said turbine-generator system includes a generator having output terminals connected to an electric transmission system, said turbine-generator system provides electric power to the electric transmission system by means of the output terminals, said method comprises:
   monitoring each of the voltages of the output terminals,
   analyzing the frequency content of each voltage to detect torsional oscillations at a plurality of resonance frequencies ($f_1$-$f_n$) of the turbine-generator system,
wherein for each resonance frequency ($f_i$), the analyzing of the frequency content comprises:
   identifying a first voltage peak in a sub-synchronous frequency sub-band ($sub_i$), and a second voltage peak in a super-synchronous frequency sub-band ($sup_i$),
   comparing the identified first voltage peak to the identified second voltage peak, and
   deducing from the comparison of the first and second voltage peak whether the turbine-generator system experience a torsional oscillation at the corresponding resonance frequency ($f_i$).

2. The method according to claim 1, including determining the frequency ($f_{sub,i}$) of the first voltage peak by determining the position of the first voltage peak within the sub-synchronous frequency sub-band ($sub_i$), and determining the frequency ($f_{sup,i}$) of the second voltage peak by determining the position of the second voltage peak within the super-synchronous frequency sub-band ($sup_i$).

3. The method according to claim 2, wherein the comparing of the first and second voltage peaks includes determining whether the determined frequency ($f_{sub,i}$) of the first voltage peak is mirrored on the opposing side of the generator fundamental frequency by the determined frequency ($f_{sup,i}$) of the second voltage peak.

4. The method according to claim 1, including determining the amplitude of each voltage peak.

5. The method according to claim 4, wherein the deducing of whether the turbine-generator system experience a torsional oscillation at the corresponding resonance frequency ($f_i$) includes establishing that the ratio between the amplitude ($U_{sub,i}$) of the first voltage peak and the amplitude ($U_{sup,i}$) of the second voltage peak, is essentially equal to the ratio between the frequency of the first voltage peak and frequency of the second voltage peak.

6. The method according to claim 1, including monitoring the current and identifying current peaks within narrow bands surrounding each sub-synchronous resonance frequency and identifying peaks within narrow bands surrounding each corresponding super-synchronous resonance frequency.

7. The method according to claim 1, including performing an action if a torsional resonance oscillation is detected, said action includes at least one of the following actions:
   a) sending a message to a transmission system operator of the electric transmission system, in order to change the properties of the electric transmission system, and
   b) sending an alarm message to a generator controller.

8. The method according to claim 7, including measuring the time from when a voltage peak is identified, and wherein the step of performing an action includes selecting an action to be performed, said selecting is based on the elapsed time, and upon reaching a first time threshold:
   sending a message to the transmission system operator of the electric transmission system, and
upon reaching a second time threshold:
   sending an alarm to a generator controller of the turbine-generator system,
wherein the first time threshold is smaller than the second time threshold.

9. The method according to claim 4, including measuring the time from when a voltage peak is identified,
   wherein the step of performing an action includes selecting a plurality of actions to be performed, said selecting is based on the elapsed time and based on the amplitude of the voltage peak, and said selected actions are performed upon fulfilling each of a plurality of criteria, and
   wherein each criteria includes a combination of an amplitude threshold and a time threshold.

10. A monitoring device for detecting torsional resonance oscillations in a turbine-generator system, said turbine-generator system includes a generator having output terminals for feeding generated electric power to an electric transmission system, said monitoring device comprising:
    input means for receiving voltage signals representing the voltages of the output terminals, and
    a control unit configured to perform a digital analysis of the frequency content of received voltage signals to detect torsional oscillations at a plurality of resonance frequencies ($f_1$-$f_n$) of the turbine-generator system, said control unit is configured for each resonance frequency ($f_i$) to:
        identify a first voltage peak in a sub-band ($sub_i$) surrounding the subsynchronous resonance frequency ($f_{sub,i}$) that corresponds to the resonance frequency ($f_i$),
        identify a second voltage peak in a sub-band ($sup_i$) surrounding the super-synchronous resonance frequency ($f_{sup,i}$) that corresponds to the resonance frequency ($f_i$); and
    wherein the control unit is configured to:
        determine the frequency of the first voltage peak by determining the position of the first voltage peak within the sub-band ($sub_i$) that surrounds the sub-synchronous resonance frequency ($f_{sub,i}$);
        determine the frequency of the second voltage peak by determining the position of the second voltage peak within the sub-band (sup) that surrounds the super-synchronous resonance frequency ($f_{sup,i}$);
        compare the determined frequency of the first voltage peak to the determined frequency of the second voltage peak; and
        deduce whether the turbine-generator system experiences a torsional oscillation at the resonance frequency ($f_i$) based on the result of the comparison of the determined frequencies.

11. The monitoring device according to claim 10, wherein the comparison of the determined frequencies establish whether the determined frequency of the first voltage peak is mirrored by the main frequency ($f_0$) of the voltage signal at the determined frequency of the second voltage peak.

12. The monitoring device according to claim 10, wherein the control unit is configured to:
    determine the amplitude ($U_{sub,i}$) of the first voltage peak;
    determine the amplitude ($U_{sup,i}$) of the second voltage peak;
    compare the determined amplitudes ($U_{sub,i}$, $U_{sup,i}$) of the first and second voltage peak, and deduce whether the turbine-generator system experience a torsional oscillation at the resonance frequency ($f_i$) based on the result of the comparison of the determined frequencies and on the result of the comparison of the determined amplitudes ($U_{sub, i}$, $U_{sup, i}$).

13. The monitoring device according to claim 12, wherein the comparison of the determined amplitudes ($U_{sub, i}$, $U_{sup, i}$) establish whether the ratio ($U_{sub, i}/U_{sup, i}$) between the amplitude ($U_{sub, i}$) of the first voltage peak and the amplitude ($U_{sup, i}$) of the second voltage peak is equal to the ratio between the determined frequency of the first voltage peak and the determined frequency of the second voltage peak.

14. The monitoring device according to claim 10, further comprising an output unit for transmitting messages, wherein the control unit is configured to:
    transmit an alert message, by means of the output unit, when a torsional resonance oscillation is detected, said alert message is transmitted to:
        a controller of the electrical transmission system, or
        a generator controller of the turbine-generator system.

15. The monitoring device according to claim 10, further comprising input means adapted for receiving current signals representing the currents of the output terminals, wherein the control unit is adapted to perform a digital analysis of the frequency content of received current signals wherein the control unit is adapted to identify current peaks within narrow bands surrounding each sub-synchronous resonance frequency and identifying peaks within narrow bands surrounding each corresponding super-synchronous resonance frequency, and is further adapted to deduce whether the turbine-generator system experience a torsional oscillation at the resonance frequency ($f_i$) from the comparison of the voltage peaks as well as from the frequency analysis of the current signals.

16. The method according to claim 7, including measuring the time from when a voltage peak is identified,
    wherein the step of performing an action includes selecting a plurality of actions to be performed, said selecting is based on the elapsed time and based on the amplitude of the voltage peak, and said selected actions are performed upon fulfilling each of a plurality of criteria, and
    wherein each criteria includes a combination of an amplitude threshold and a time threshold.

17. The monitoring device according to claim 11, wherein the control unit is configured to:
    determine the amplitude ($U_{sub, i}$) of the first voltage peak;
    determine the amplitude ($U_{sup, i}$) of the second voltage peak;
    compare the determined amplitudes ($U_{sub, i}$, $U_{sup, i}$) of the first and second voltage peak, and
    deduce whether the turbine-generator system experience a torsional oscillation at the resonance frequency ($f_i$) based on the result of the comparison of the determined frequencies and on the result of the comparison of the determined amplitudes ($U_{sub, i}$, $U_{sup, i}$).

* * * * *